(12) United States Patent
Luo et al.

(10) Patent No.: US 8,105,887 B2
(45) Date of Patent: Jan. 31, 2012

(54) INDUCING STRESS IN CMOS DEVICE

(75) Inventors: Zhijiong Luo, Carmel, NY (US);
QingQing Liang, Hopewell Junction, NY (US); Haizhou Yin, Hopewell Junction, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 12/500,107

(22) Filed: Jul. 9, 2009

(65) Prior Publication Data

US 2011/0006371 A1    Jan. 13, 2011

(51) Int. Cl.
*H01L 21/8238* (2006.01)
*H01L 21/84* (2006.01)

(52) U.S. Cl. ........ 438/154; 438/233; 438/300; 438/459; 438/672; 438/674; 257/E27.112; 257/E21.431; 257/E21.561

(58) Field of Classification Search .................. 438/153, 438/154, 233, 300, 459, 672, 674; 257/E27.112, 257/E21.431, E21.561
See application file for complete search history.

(56) References Cited

U.S. PATENT DOCUMENTS

| | | | |
|---|---|---|---|
| 6,614,068 B1 * | 9/2003 | Chung | 257/306 |
| 6,838,332 B1 * | 1/2005 | Sanchez et al. | 438/239 |
| 2006/0131657 A1 * | 6/2006 | Hamaguchi | 257/369 |
| 2008/0179678 A1 * | 7/2008 | Dyer et al. | 257/351 |
| 2009/0001466 A1 * | 1/2009 | Yang et al. | 257/347 |
| 2010/0019385 A1 * | 1/2010 | Bartley et al. | 257/741 |

\* cited by examiner

*Primary Examiner* — Mary Wilczewski
*Assistant Examiner* — Toniae Thomas
(74) *Attorney, Agent, or Firm* — Yuanmin Cai; Hoffman Warnick LLC

(57) ABSTRACT

A first aspect of the invention provides a method of forming a semiconductor device, the method comprising: providing a complimentary metal oxide semiconductor (CMOS) device including: a silicon substrate layer; a silicon dioxide layer thereover; and an n-type field effect transistor (NFET) gate having a first recessed source/drain trench and a p-type field effect transistor (PFET) gate having a second recessed source/drain trench, the NFET gate and the PFET gate located over the silicon dioxide layer; depositing a nitride stress liner in the first recessed source/drain trench and the second recessed source/drain trench; depositing an oxide layer over the nitride stress liner; placing the CMOS device on a handling wafer, wherein the oxide layer is closest to the handling wafer; removing the silicon substrate layer; etching the silicon dioxide layer to form an opening abutting a portion of a source/drain region, the source/drain region abutting one of the first recessed source/drain trench or the second recessed source/drain trench; and forming a contact in the opening.

7 Claims, 15 Drawing Sheets

INDUCING STRESS IN CMOS DEVICE

BACKGROUND OF THE INVENTION

The subject matter disclosed herein relates to solutions for inducing stress in a Complementary Metal Oxide Semiconductor (CMOS). More specifically, the subject matter disclosed herein relates to systems and methods for forming a nitride stress liner in a CMOS device.

Semiconductor device designers continually work to make semiconductor devices smaller while increasing their level of performance. One approach to increasing performance is the use of stress liners over portions of these devices. Stress liners may be particularly helpful, for example, in increasing electron/hole mobility in device channels. However, stress liners located near device channels may cause complications during contact formation, and may adversely affect device performance.

BRIEF DESCRIPTION OF THE INVENTION

Solutions for inducing stress in a complimentary metal oxide semiconductor (CMOS) device are disclosed. In one aspect, a method of forming a semiconductor device is disclosed, the method comprising: providing a CMOS device including: a silicon substrate layer; a silicon dioxide layer thereover; and an n-type field effect transistor (NFET) gate having a first recessed source/drain trench and a p-type field effect transistor (PFET) gate having a second recessed source/drain trench, the NFET gate and the PFET gate located over the silicon dioxide layer; depositing a nitride stress liner in the first recessed source/drain trench and the second recessed source/drain trench; depositing an oxide layer over the nitride stress liner; placing the CMOS device on a handling wafer, wherein the oxide layer is closest to the handling wafer; removing the silicon substrate layer; etching the silicon dioxide layer to form an opening abutting a portion of a source/drain region, the source/drain region abutting one of the first recessed source/drain trench or the second recessed source/drain trench; and forming a contact in the opening.

A first aspect of the invention provides a method of forming a semiconductor device, the method comprising: providing a complimentary metal oxide semiconductor (CMOS) device including: a silicon substrate layer; a silicon dioxide layer thereover; and an n-type field effect transistor (NFET) gate having a first recessed source/drain trench and a p-type field effect transistor (PFET) gate having a second recessed source/drain trench, the NFET gate and the PFET gate located over the silicon dioxide layer; depositing a nitride stress liner in the first recessed source/drain trench and the second recessed source/drain trench; depositing an oxide layer over the nitride stress liner; placing the CMOS device on a handling wafer, wherein the oxide layer is closest to the handling wafer; removing the silicon substrate layer; etching the silicon dioxide layer to form an opening abutting a portion of a source/drain region, the source/drain region abutting one of the first recessed source/drain trench or the second recessed source/drain trench; and forming a contact in the opening.

A second aspect of the invention provides a semiconductor device comprising: a silicon dioxide layer; an n-type field effect transistor (NFET) including at least one recessed source/drain trench and located over a portion of the silicon dioxide layer; a p-type field effect transistor (PFET) including at least one recessed source/drain trench and located over a portion of the silicon dioxide layer; a nitride stress liner over the NFET and the PFET, the nitride stress liner filling the at least one recessed source/drain trench of the NFET and the at least one recessed source/drain trench of the PFET; and a first contact formed in the silicon dioxide layer, the first contact abutting one of the NFET or the PFET.

A third aspect of the invention provides a semiconductor device comprising: a silicon dioxide layer; an n-type field effect transistor (NFET) including at least one recessed source/drain trench and located over a portion of the silicon dioxide layer; a p-type field effect transistor (PFET) including at least one recessed source/drain trench and located over a portion of the silicon dioxide layer; a first spacer abutting the NFET and a second spacer abutting the PFET; a nitride stress liner over the NFET and the PFET, the nitride stress liner filling the at least one recessed source/drain trench of the NFET and the at least one recessed source/drain trench of the PFET; and a first contact formed in the silicon dioxide layer, the first contact abutting one of the NFET or the PFET.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Figure 1:
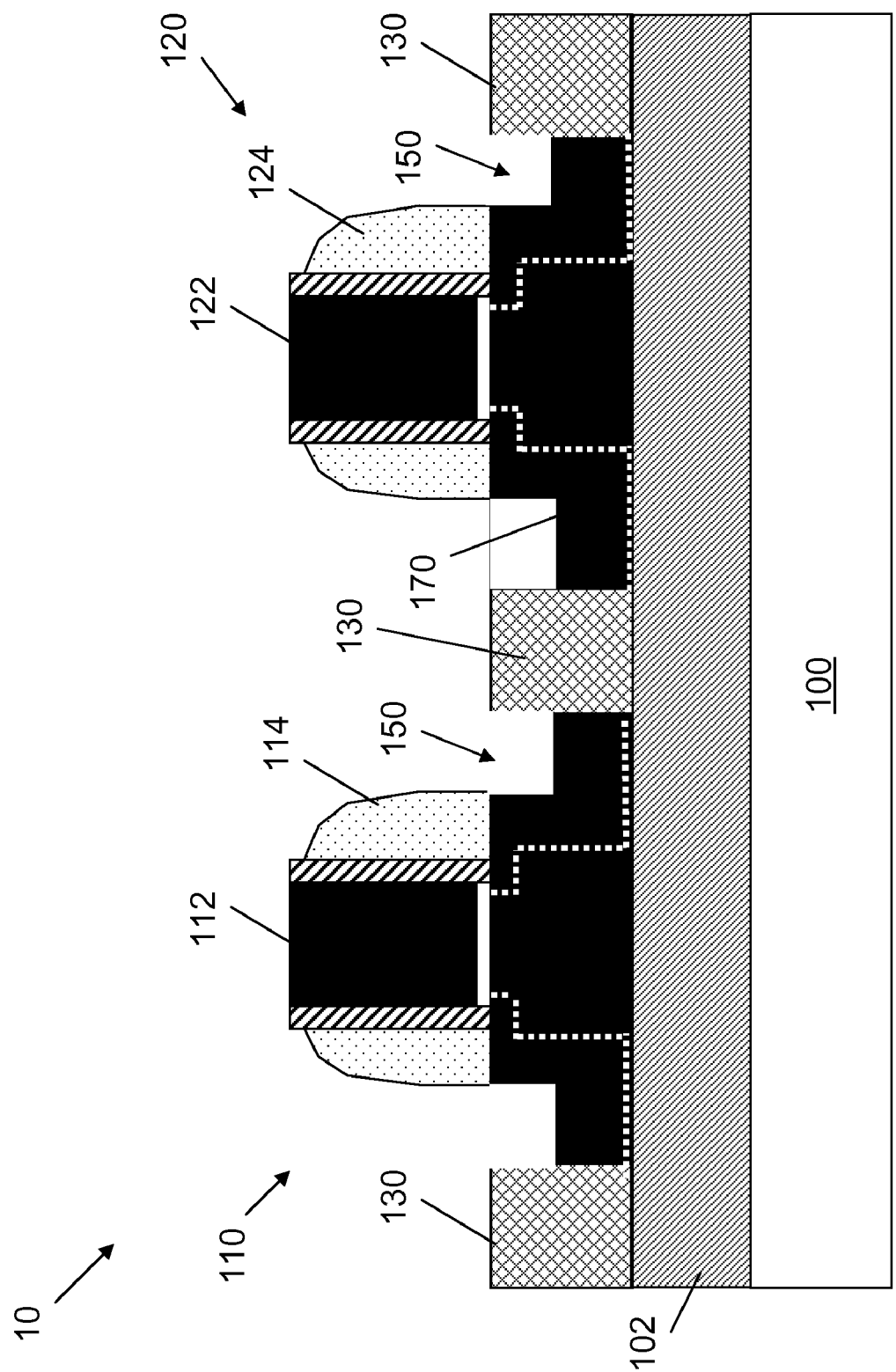
FIGS. 1-8 show cross-sectional views of steps in forming a semiconductor device according to embodiments of the invention.

Turning to the figures, a method of forming a semiconductor device is shown in FIGS. 1-8. In particular, a method of forming a nitride stress liner over a complementary metal oxide semiconductor (CMOS) device is shown. FIG. 1 shows a complimentary metal oxide semiconductor (CMOS) device 10 including an N-type field effect transistor (NFET) device 110 and a P-type field effect transistor (PFET) device 120. CMOS device 10 may include a substrate 100 and a silicon dioxide layer 102 located thereover. Silicon substrate layer 100 and silicon dioxide layer 102 may be deposited in any conventional manner described herein or known in the art of semiconductor fabrication. As is known in the art, the term "MOS" device refers to a metal oxide semiconductor field effect transistor (MOSFET). As used herein, the term "MOS" device refers to various forms of MOSFETs. CMOS device 10 of FIGS. 1-8 may be formed in any conventional manner, such as by deposition, etching and/or growth techniques known in the art. CMOS device 10 may include a silicon substrate layer 100, a silicon dioxide layer 102 thereover, NFET device 110, PFET device 120, and at least one shallow trench isolation (STI) 130 located adjacent NFET device 110 and/or PFET device 120. As is known in the art, STI 130 may prevent leakage of electrical current between NFET device 110 and PFET device 120. STI 130 may be formed prior to NFET device 110 and PFET device 120, and may include a dielectric material such as silicon dioxide. NFET device 110 may include an NFET gate 112, and PFET device 120 may include a PFET gate 122. NFET gate 112 and PFET gate 122 may each provide points of contact for layers (not shown) formed over CMOS device 10. Further, in one embodiment, CMOS device 10 may include a first spacer 114 abutting NFET device 110 and a second spacer 124 abutting PFET device 120.

As shown in FIG. 1, CMOS device 10 further includes at least one recessed source/drain trench 150. Recessed source/drain trench 150 may be formed in any conventional manner, such as by selective etching using techniques described herein and/or known in the art. As shown in FIG. 1, recessed source/drain trench 150 may abut a source/drain region 170, and may allow for formation of a stress liner (FIG. 2) in close proximity to source and/or gate regions of NFET device 110 and/or PFET device 120.

Figure 2:
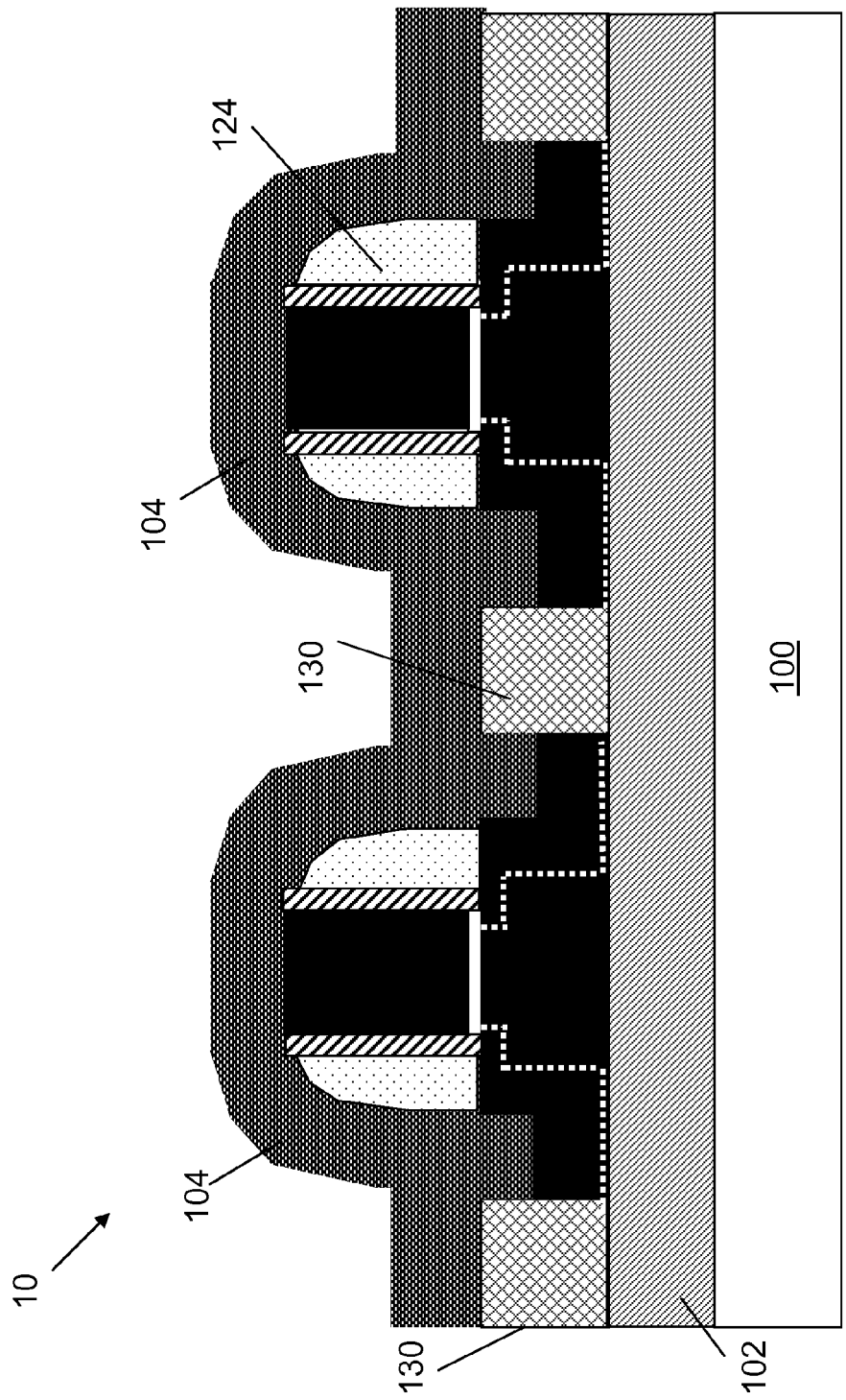

FIG. 2 shows a nitride stress liner 104 deposited over CMOS device 10 of FIG. 1. Nitride stress liner 104 may be deposited in any conventional manner described herein or known in the art. For example, nitride stress liner 104 may be deposited over CMOS device 10 via physical vapor deposition (PVD). After deposition, nitride stress liner 104 may be polished using, for example, chemical mechanical polishing (CMP). Nitride stress liner 104 may be formed of a tensile or compressively-stressed nitride. Nitride stress liner 104 may include, for example, one or more of a silicon nitride or a silicon boron nitride. Nitride stress liner 104 may fill at least one of recessed source/drain trenches 150. In one embodiment, nitride stress liner 104 fills both recessed source trench 150 of NFET device 110 and/or recessed drain trench 150 of PFET device 120. Filling recessed source/drain trenches 150 with nitride stress liner 104 may provide for increased stress on source and/or gate regions of NFET device 110 and/or PFET device 120, and improved performance for CMOS device 10. For example, nitride stress liner 104 may improve performance by up to one-hundred and ten percent.

Figure 3:
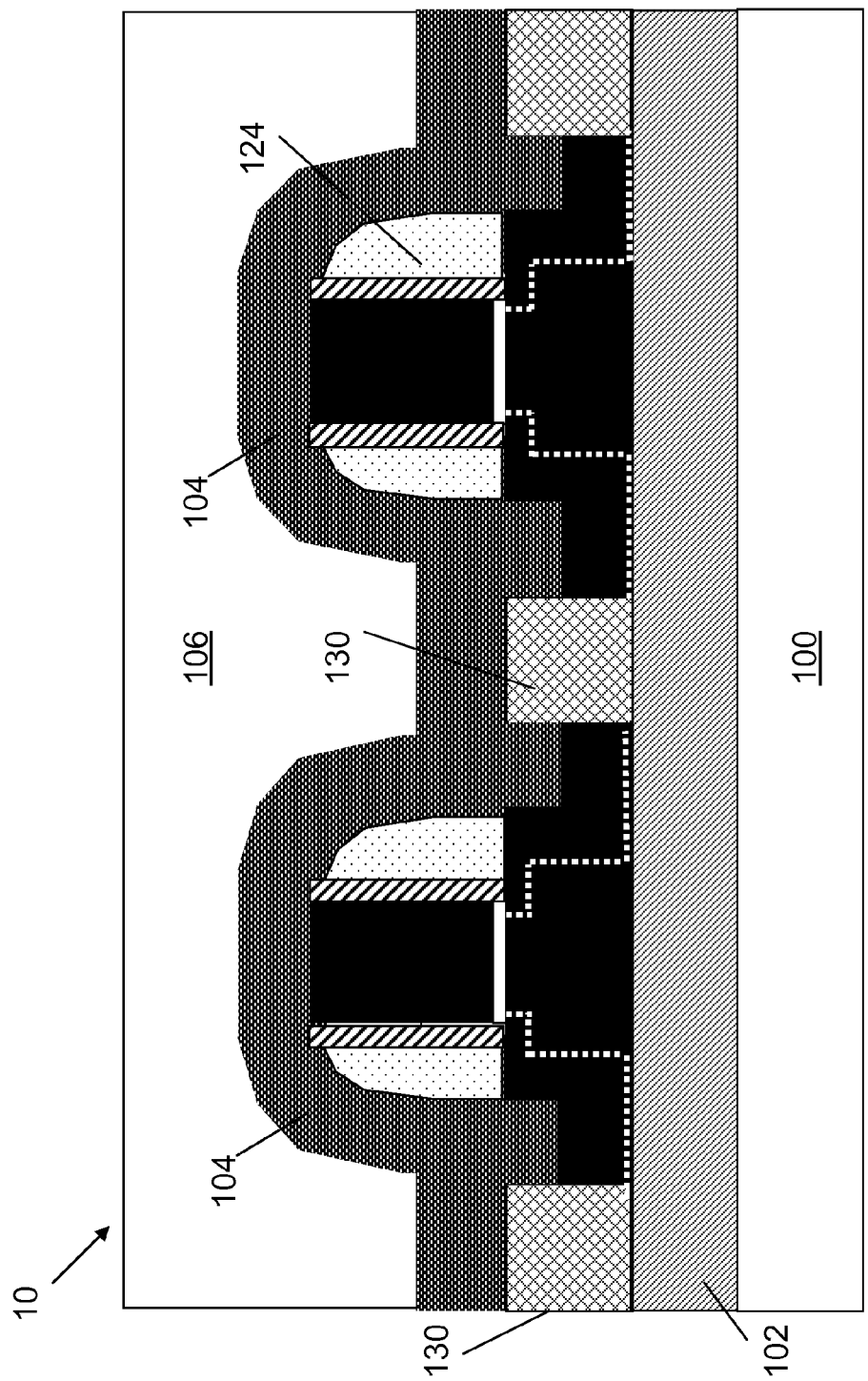

FIG. 3 shows CMOS device 10, including an oxide layer 106 deposited over nitride stress liner 104. Oxide layer 106 may include, for example, silicon dioxide or tetraethyl orthosilicate (TEOS). Oxide layer 106 may be deposited in any conventional manner, such as those described herein. For example, in one embodiment, oxide layer 106 is deposited via PVD and then polished using CMP.

Figure 4:
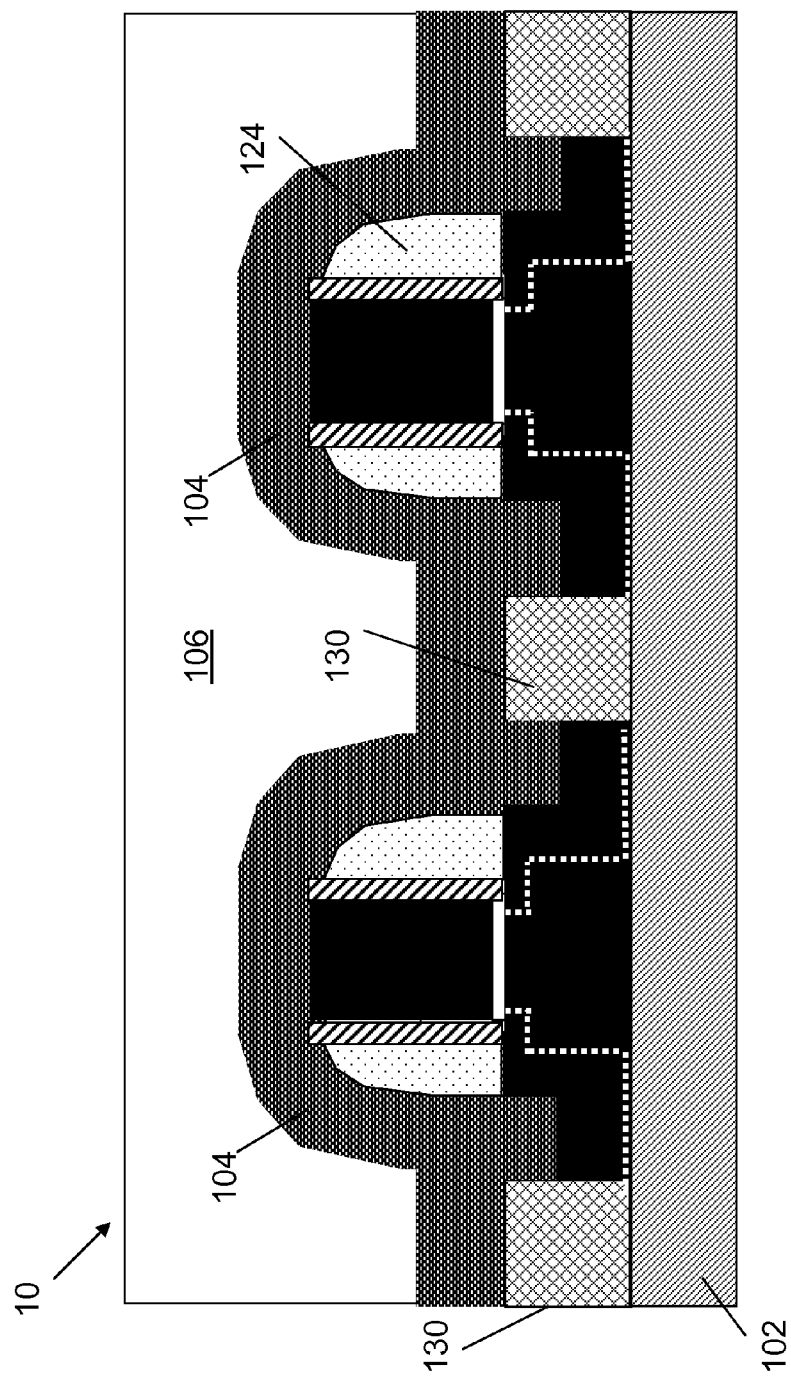

Turning to FIG. 4, CMOS device 10 of FIG. 3 is shown after removal of silicon substrate layer 100. In one embodiment, the removal may include placing CMOS device 10 on a handling wafer (not shown), wherein oxide layer 106 is closest to the handling wafer. This process may be referred to as "flipping", wherein CMOS device 10 sits 180 degrees from its position as shown in FIGS. 3-4. Once CMOS device 10 is placed on the handling wafer, silicon substrate layer 100 may be removed. Removing of silicon substrate layer 100 may include, for example, etching and CMP. In one embodiment, silicon substrate layer 100 may be removed using a reactive ion etching (RIE) process including hydrofluoric acid (HF).

Figure 5:
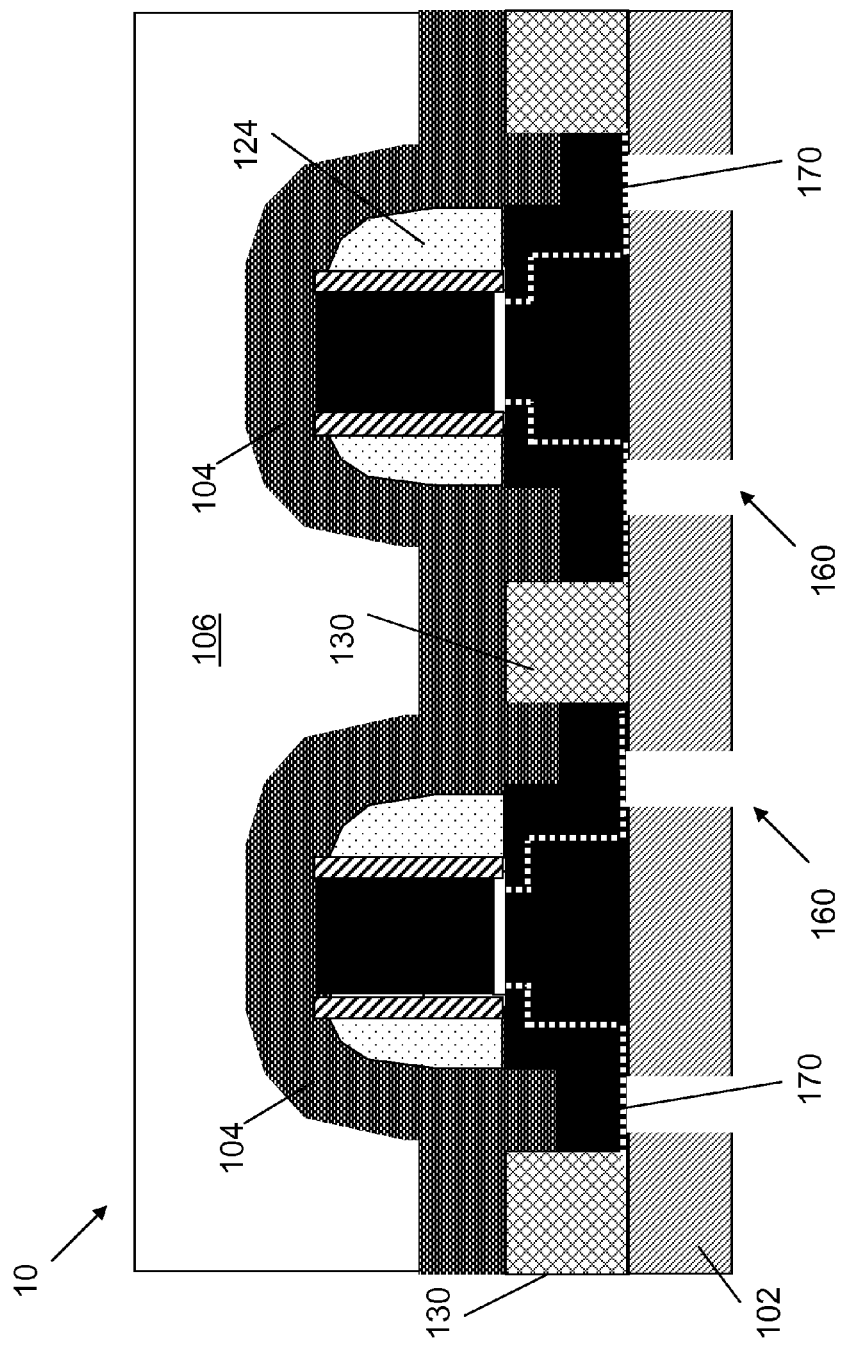

FIG. 5 shows CMOS device 10 of FIG. 4 after etching of silicon dioxide layer 102 to form an opening 160. Etching of silicon dioxide layer 102 may include any conventional etching techniques, such as those described herein. In one embodiment, etching may include RIE, which may aid in selectively forming opening 160 in silicon dioxide layer 102. However, other selective etching techniques known in the art may be used as well. As shown in FIG. 5, opening 160 may abut a portion of source/drain region 170.

Figure 6:
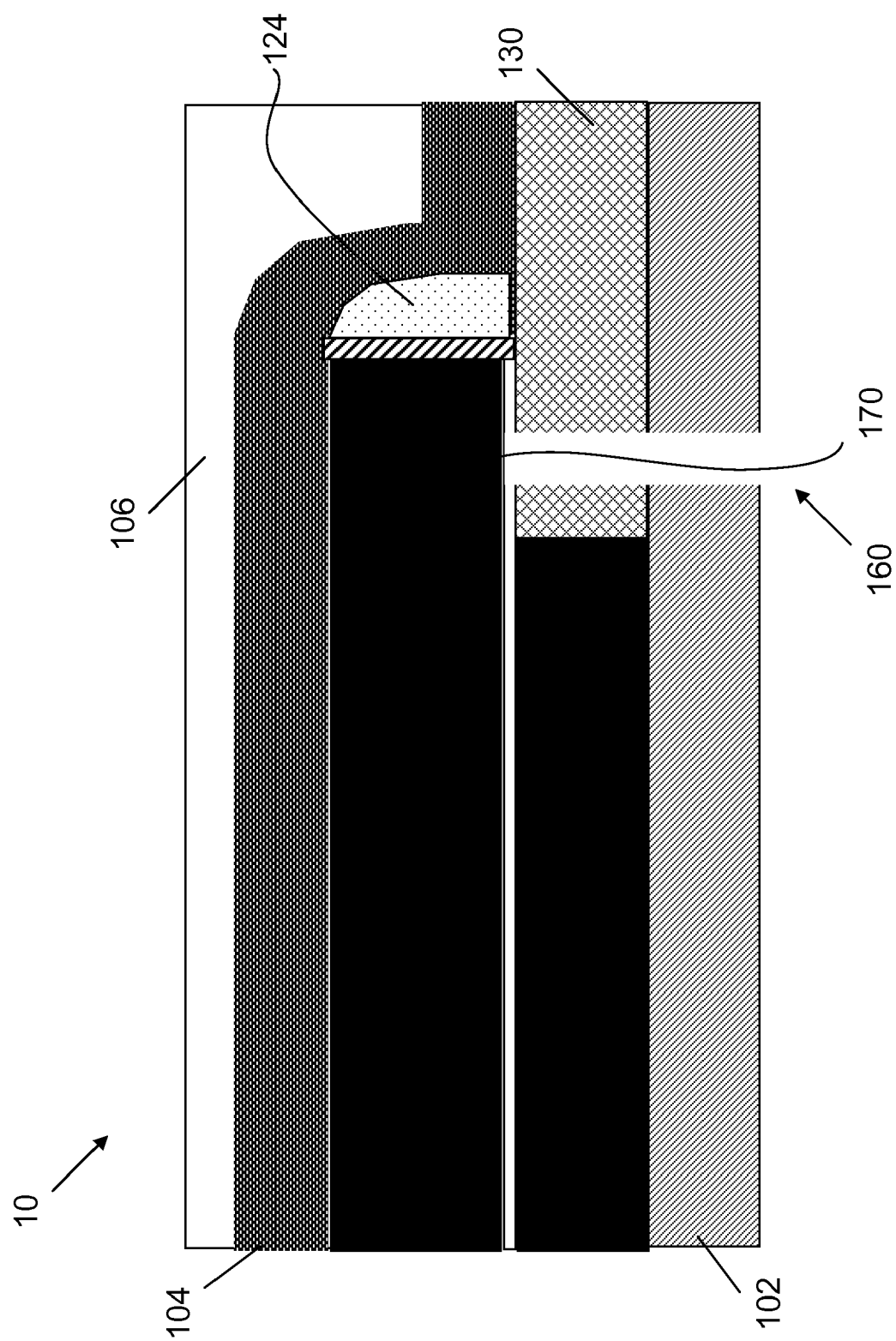

FIG. 6 shows another cross-sectional view of the CMOS device 10 of FIG. 5. The cross-sectional view shown in FIG. 6 is taken from the same CMOS device 10 of FIG. 5, but the cross-sectional cut was made at a 90 degree angle from the depiction of FIG. 5. As shown in FIG. 6, opening 160 may directly abut a portion of source/drain region 170. Further, as shown in FIG. 6, opening 160 may extend across the length of STI 130 to abut the portion of source/drain region 170.

Figure 7:
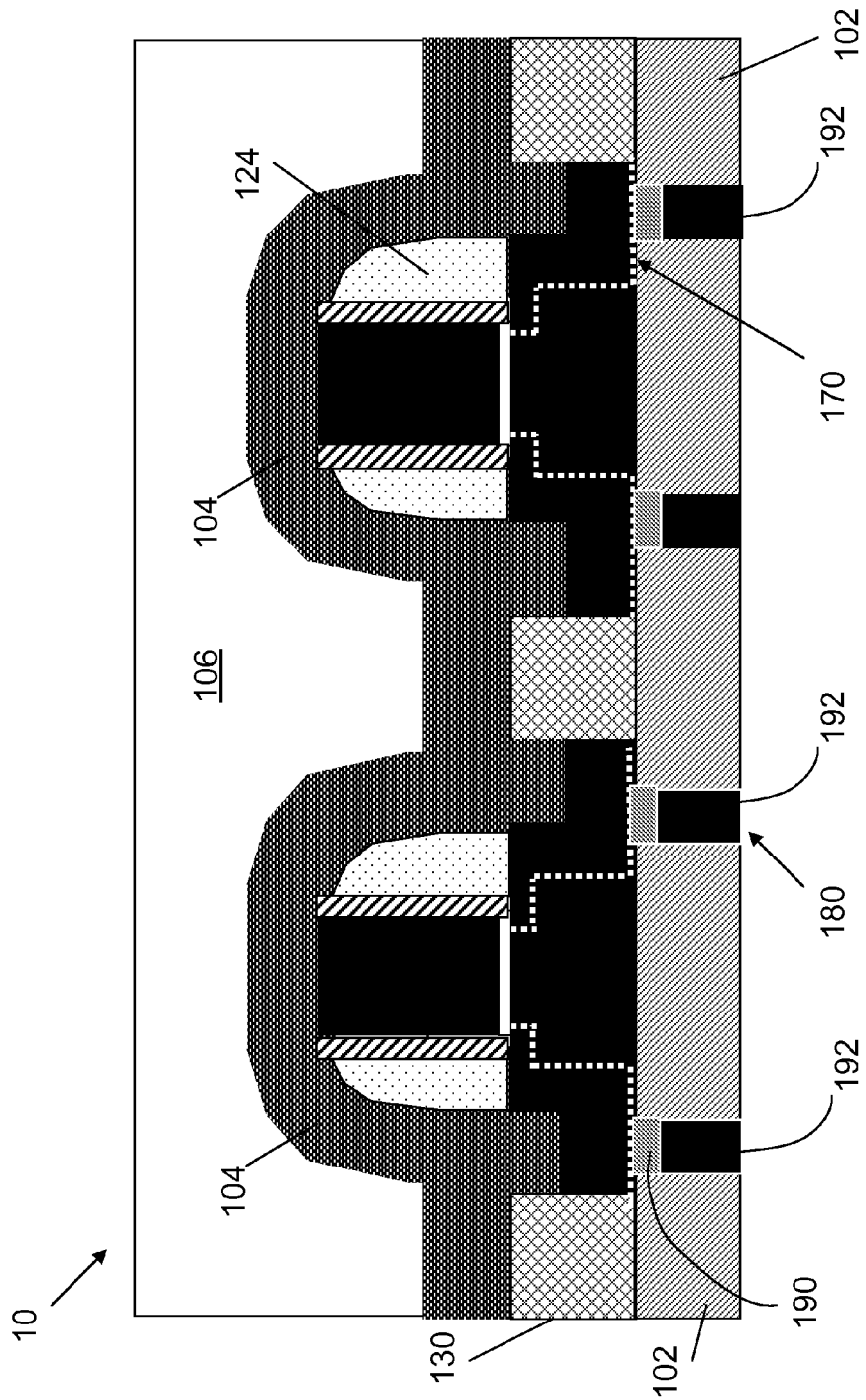

Turning to FIG. 7, a contact 180 is shown formed in (filled) opening 160 (labeling omitted) within silicon dioxide layer 102. Contact 180 may include a silicide portion 190 and a metal portion 192. In one embodiment, silicide portion 190 is selectively deposited in opening 160 and over source/drain region 170 (while on handling wafer). Silicide portion 190 may be deposited using any conventional deposition techniques described herein and/or known in the art. Silicide portion 190 may include a metal, such as, for example, platinum. In one embodiment, silicide portion 190 may include nickel (Ni) and/or titanium nitride (TiN). Silicide portion 190 may act as an interface between source/drain region 170 and metal portion 192. In this respect, silicide portion 190 may provide the benefit of lowering the resistance between silicon dioxide layer 102 and source/drain region 170. Contact 180 may further include metal portion 192. In one embodiment, metal portion 192 is selectively deposited in opening 160 over silicide portion 190 (while on handling wafer). Metal portion 192 may be deposited using any conventional deposition techniques described herein and/or known in the art. Metal portion 192 may include a contact metal such as, for example, tungsten, aluminum, and/or copper. Metal portion 192 may provide a contact between CMOS device 10 and external circuitry, other semiconductor devices, etc. (not shown).

Figure 8:
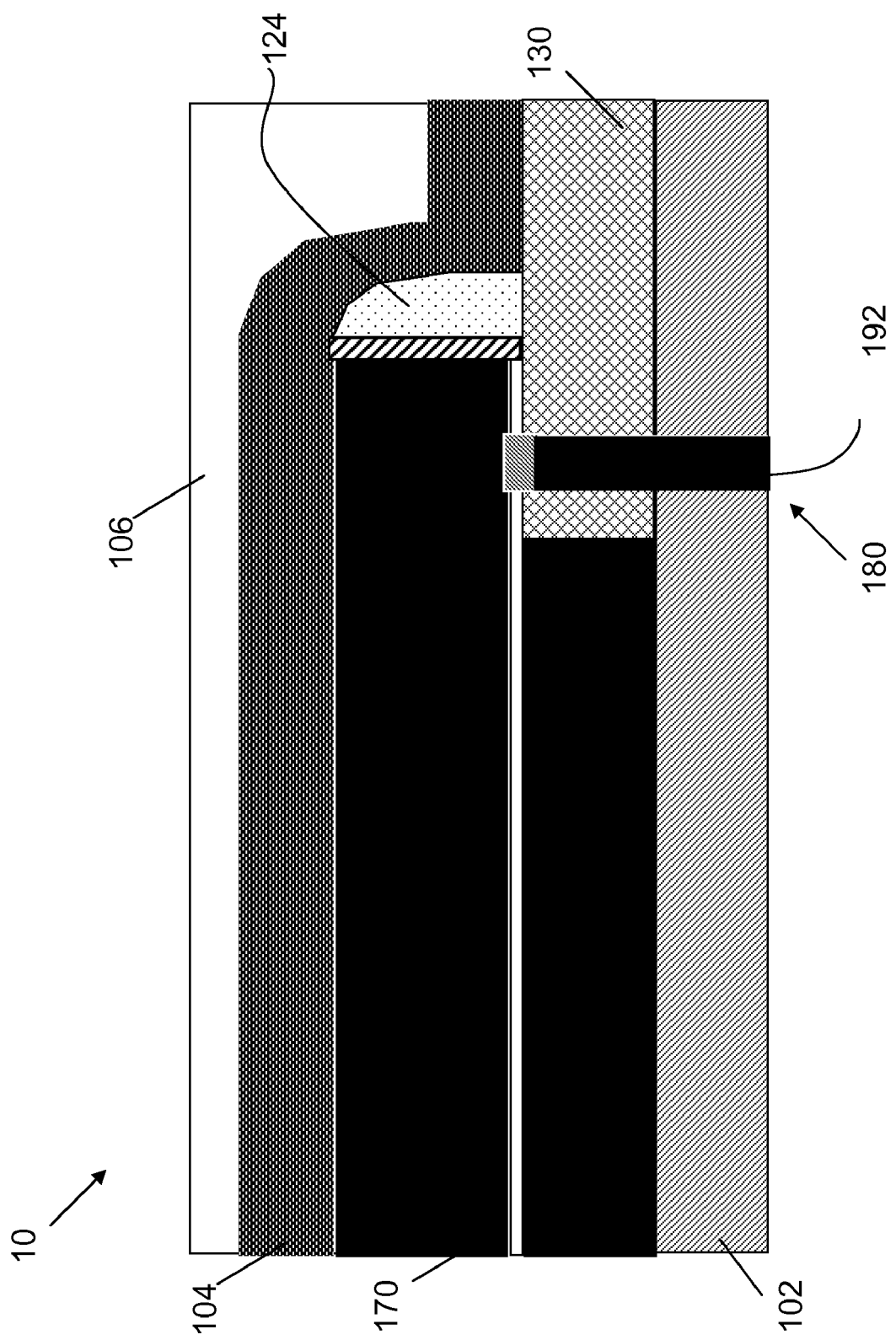

Turning to FIG. 8, another cross-sectional view of the CMOS device 10 of FIG. 7 is shown. The cross-sectional view shown in FIG. 8 is taken from the same CMOS device 10 of FIG. 7, but the cross-sectional cut was made at a 90 degree angle from the depiction of FIG. 7. FIG. 8 shows a similar cross-sectional perspective to that shown and referenced in FIG. 6. As shown FIG. 8, contact 180 may directly abut a portion of source/drain region 170. Further, as shown in FIG. 8, opening 180 may extend across a length of STI 130 to abut the portion of source/drain region 170.

Figure 9:
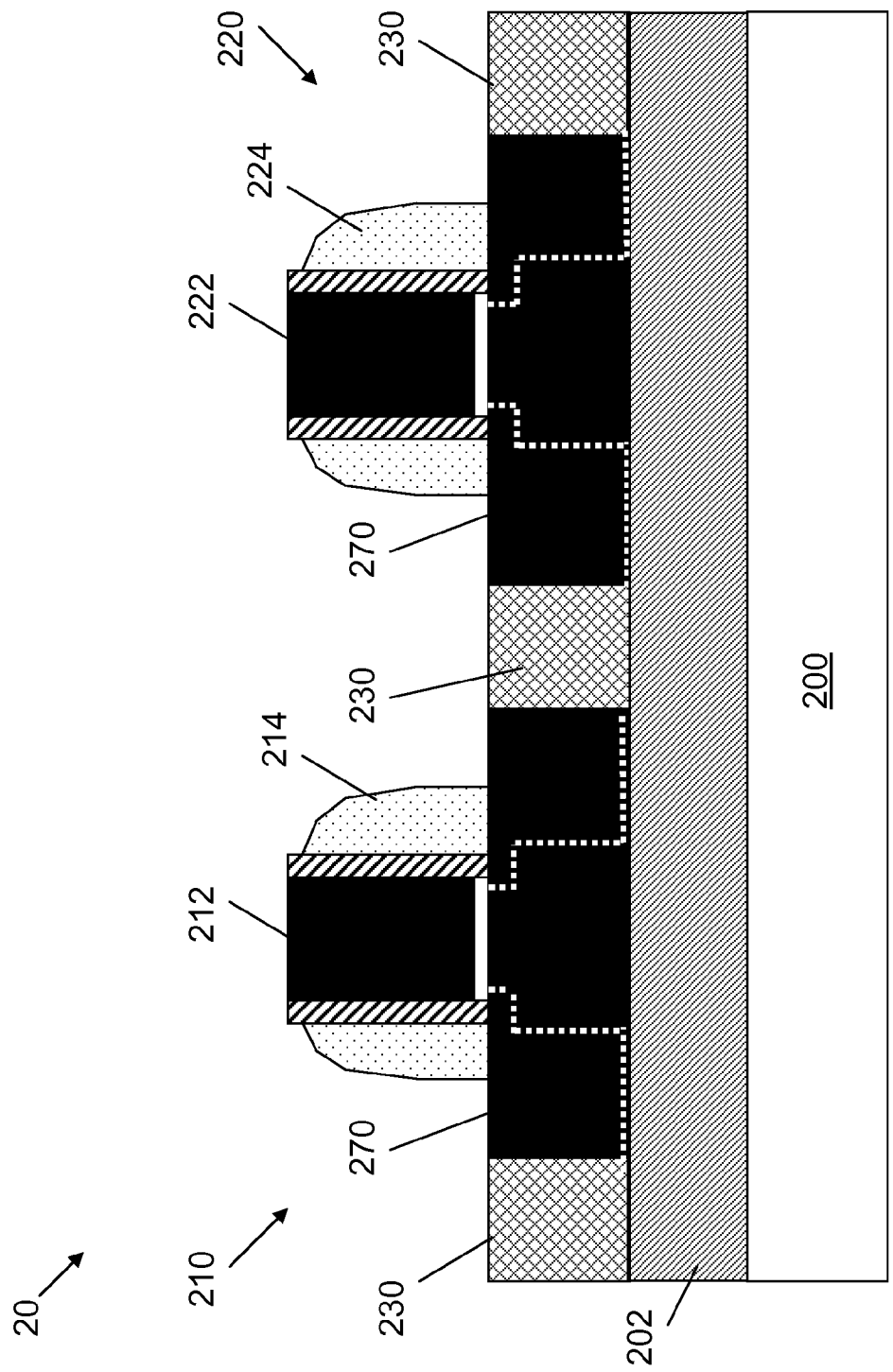
FIGS. 9-11 show cross-sectional views of steps in forming a semiconductor device according to an alternative embodiment of the invention.

FIG. 9 shows an alternative embodiment, in which a second CMOS device 20 is formed using conventional techniques. CMOS device 20 may be substantially similar to CMOS device 10 of FIG. 1; however, CMOS device 20 does not include one or more recessed source/drain trenches as shown and described with reference to FIG. 1. As shown, CMOS device 20 may include a silicon substrate layer 200, a silicon dioxide layer 202 thereover, an NFET device 210, a PFET device 220, and at least one shallow trench isolation (STI) 230 located adjacent NFET device 210 and/or PFET device 220. As is known in the art, STI 230 may prevent leakage of electrical current between NFET device 210 and PFET device 220. STI 230 may be formed prior to NFET device 210 and PFET device 220, and may include a dielectric material such as silicon dioxide. NFET device 210 may include an NFET gate 212 and a source/drain region 270, and PFET device 220 may include a PFET gate 222 and a source/drain region 270. NFET gate 212 and PFET gate 222 may each provide points of contact for layers (not shown) formed over CMOS device 20. Further, as shown in FIG. 9, CMOS device 20 may include a first spacer 214 abutting NFET device 210 and a second spacer 224 abutting PFET device 220.

Figure 10:
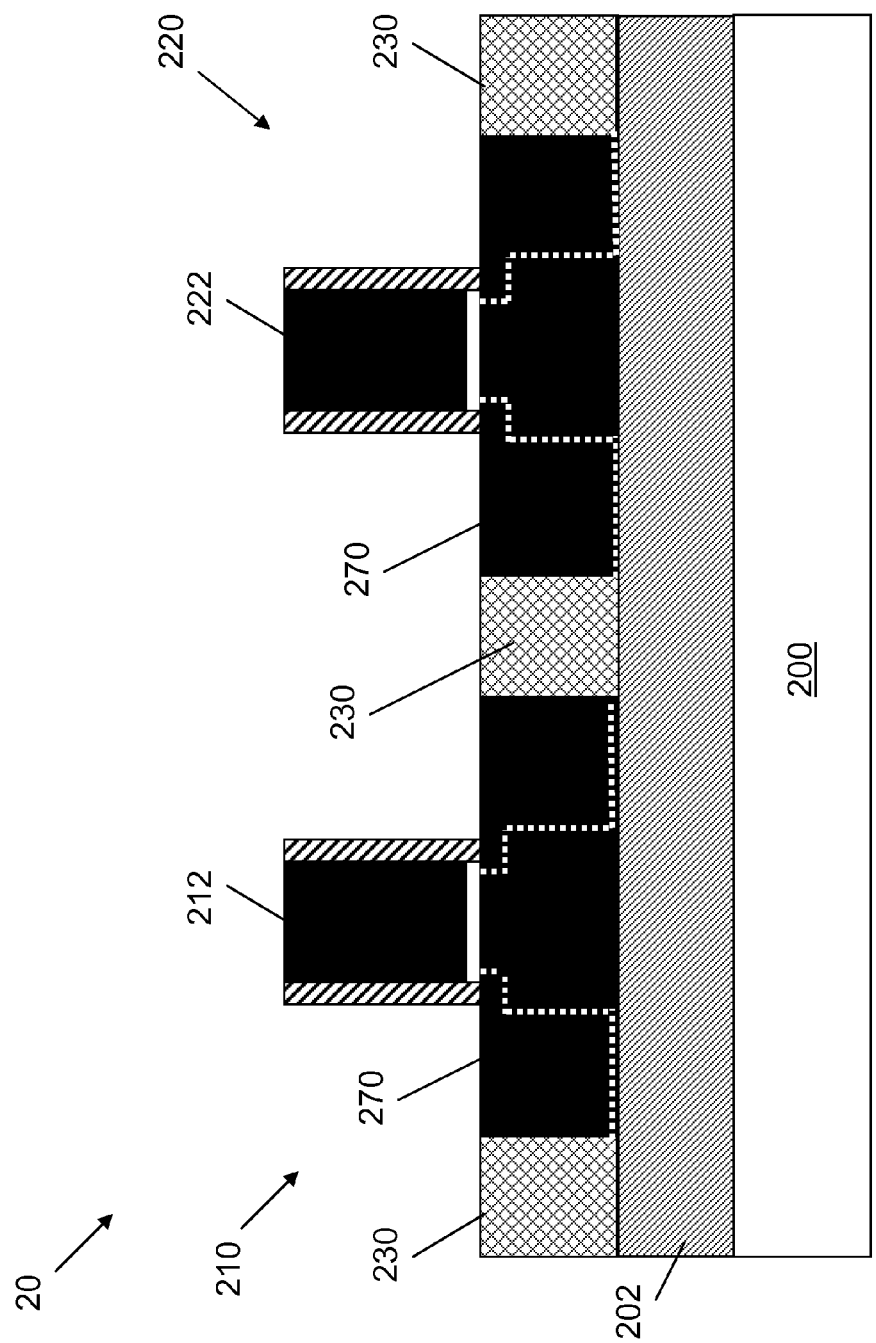

Turning to FIG. 10, CMOS device 20 is shown after removal of first spacer 214 and second spacer 224. As shown, additional spacers (214, 224) may also be removed. Spacers 214, 224 may be removed using standard etching techniques known in the art or described herein. For example, spacers 214, 224 may be removed via a hot phosphoric bath or RIE. In any case, removal of spacers 214, 224 allows for better access to source/drain region 270 of NFET device 210 and/or PFET device 220 (as described with reference to FIG. 11).

Figure 11:
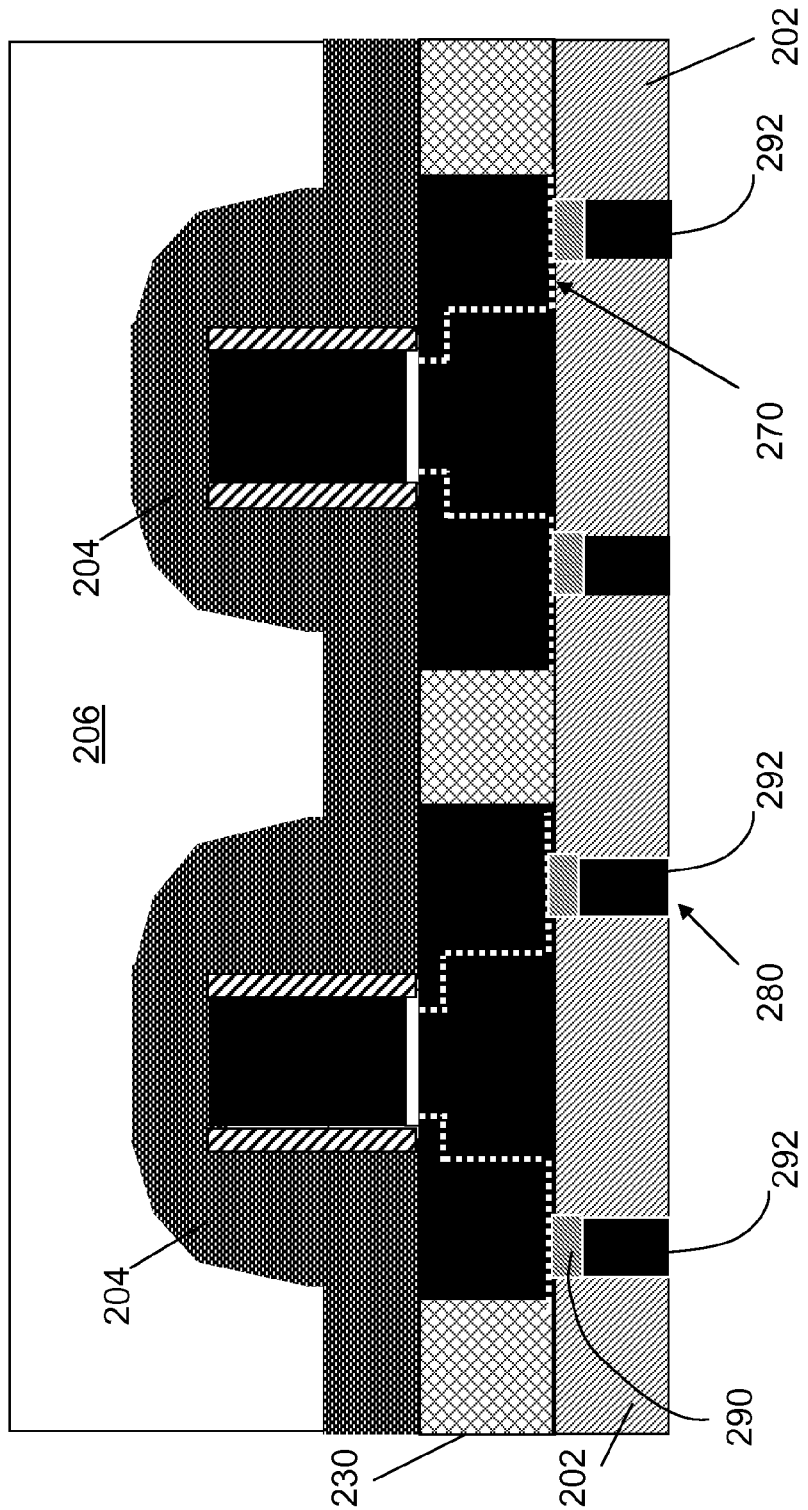

FIG. 11 shows CMOS device 20 of FIG. 10, after depositing of nitride stress liner 204 over NFET device 210 and PFET device 220, depositing of oxide layer 206 over nitride stress liner 204, removing of silicon substrate layer 200, and forming of contacts 280 in silicon dioxide layer 202. Deposition of nitride stress liner 204 and oxide layer 206 may be performed substantially similarly to the similar deposition steps shown and described with reference to FIGS. 2-8. As shown in FIG. 11, removal of spacers 214, 224 allows for deposition of nitride stress liner 204 in close proximity to source/drain region 270. This allows for greater stress on source/drain region 270, which further improves performance of CMOS device 210.

Figure 12:
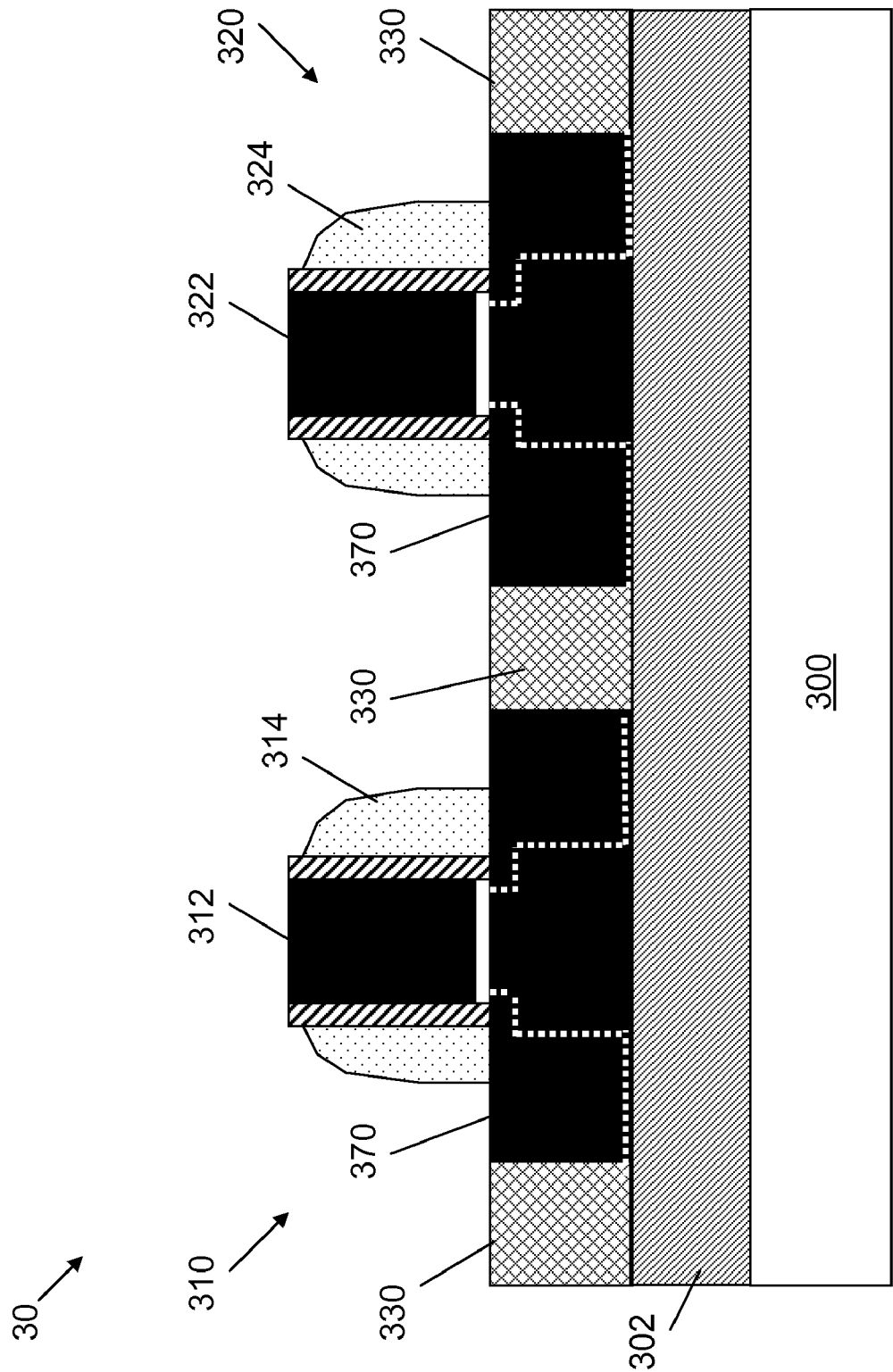
FIGS. 12-15 show cross-sectional views of steps in forming a semiconductor device according to another alternative embodiment of the invention.

FIG. 12 shows another alternative embodiment in which a CMOS device 30 is formed according to conventional techniques. CMOS device 30 depicted in FIG. 12 may be substantially similar to CMOS device 20 of FIG. 9. As shown, CMOS device 30 may include a silicon substrate layer 300, a silicon dioxide layer 302 thereover, an NFET device 310, a PFET device 320, and at least one shallow trench isolation (STI) 330 located adjacent NFET device 310 and/or PFET device 320. As is known in the art, STI 330 may prevent leakage of electrical current between NFET device 310 and PFET device 320. STI 330 may be formed prior to NFET device 310 and PFET device 320, and may include a dielectric material such as silicon dioxide. NFET device 310 may include an NFET gate 312 and a source/drain region 370, and PFET device 320 may include a PFET gate 322 and source/drain region 370. NFET gate 312 and PFET gate 322 may each provide points of contact for layers (not shown) formed over CMOS device 30. Further, as shown in FIG. 9, CMOS device 30 may include a first spacer 314 abutting NFET device 310 and a second spacer 324 abutting PFET device 320.

Figure 13:
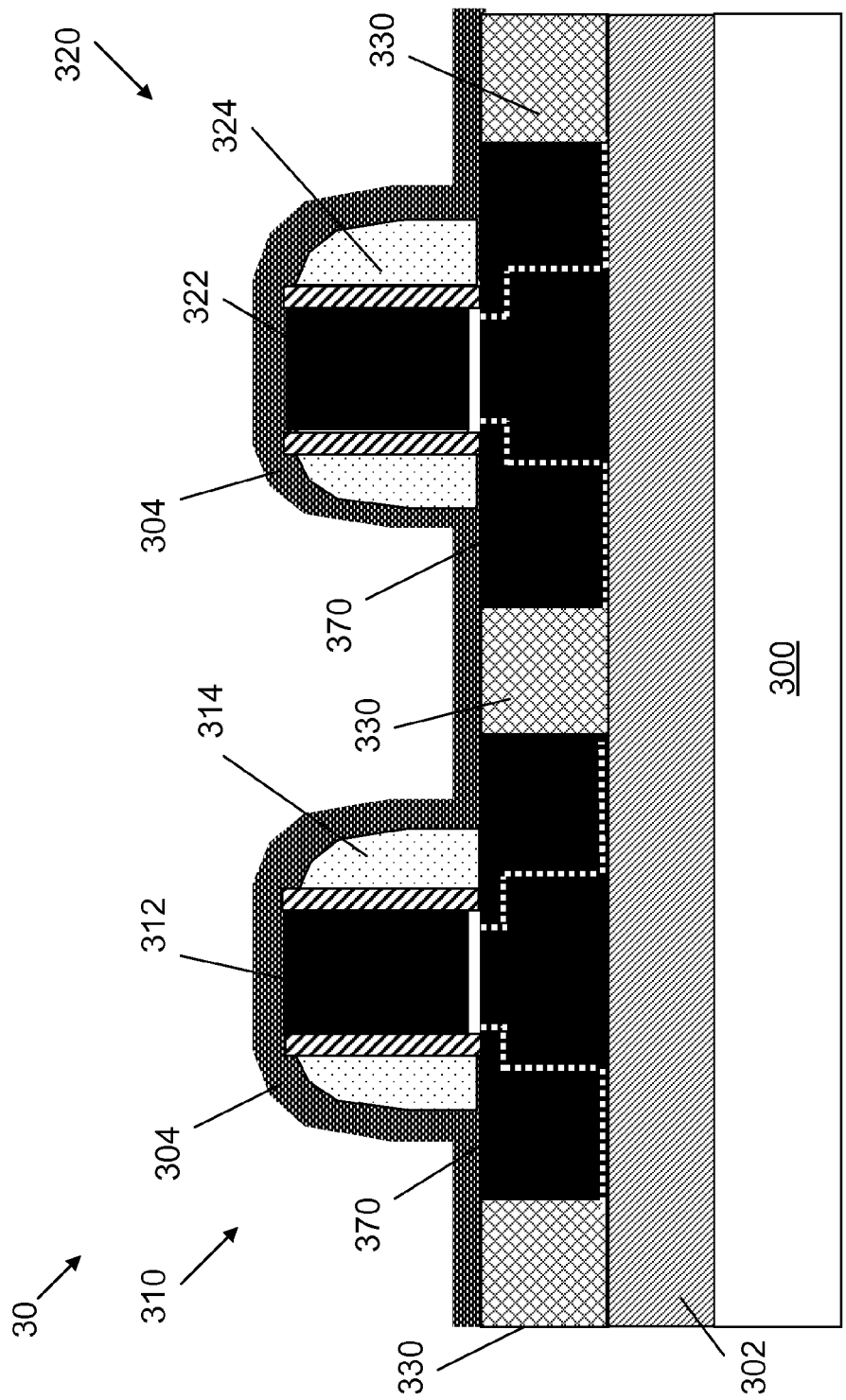

FIG. 13 shows a nitride stress liner 304 deposited over CMOS device 30 of FIG. 12. Nitride stress liner 304 may be deposited in any conventional manner described herein and/or known in the art. For example, nitride stress liner 304 may be deposited over CMOS device 30 via physical vapor deposition (PVD). After deposition, nitride stress liner 304 may be polished using, for example, chemical mechanical polishing (CMP). Nitride stress liner 304 may be formed of a tensile or compressively-stressed nitride. Nitride stress liner 304 may include one or more of silicon nitride and/or silicon boron nitride. Nitride stress liner 304 may be of a thickness of approximately 30 to 600 Angstroms.

Figure 14:
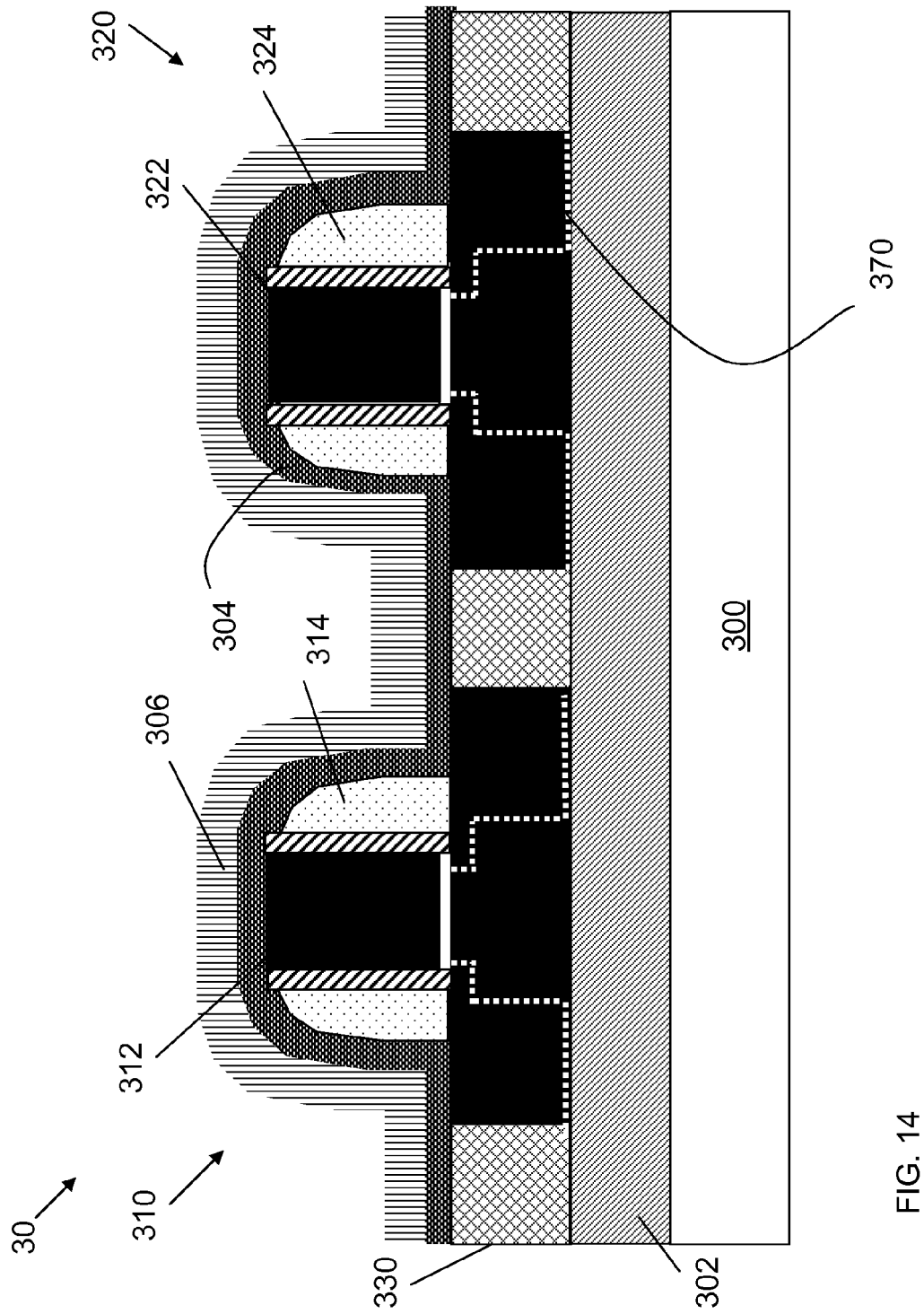

FIG. 14 shows CMOS device 30 of FIG. 13 after depositing of a high-stress metal liner 308 over nitride stress liner 304. As used herein, the term "high-stress" liner may refer to any material having characteristics capable of inducing stress on a magnitude of approximately 0.1 to 4 Gigapascals (GPa) on an underlying material (or layer). High-stress liner 308 may include, for example, titanium nitride (TiN). However, high-stress liner 308 may include one or more other materials capable of inducing "high-stress" levels on underlying layers.

Figure 15:
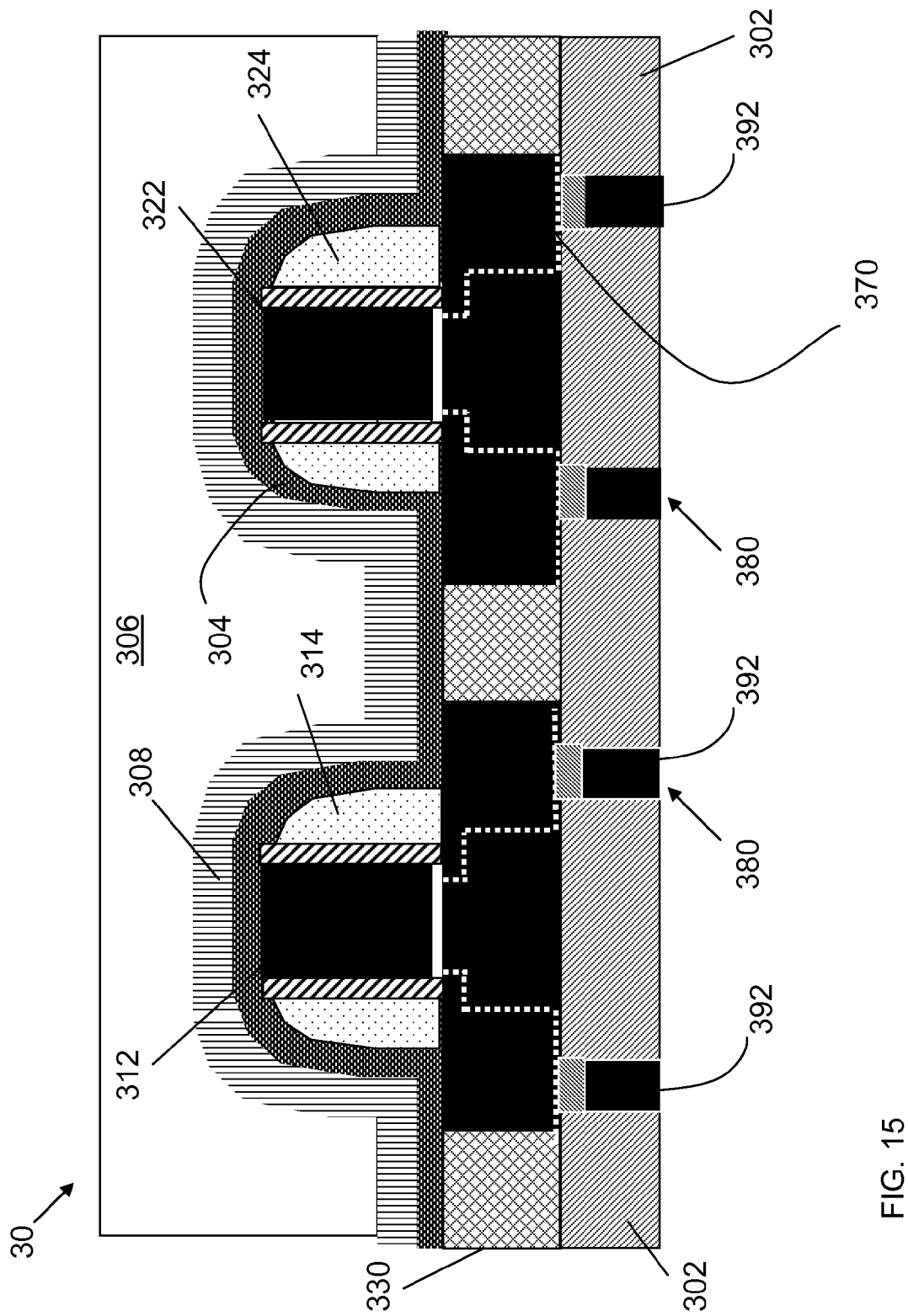

FIG. 15 shows CMOS device 30 of FIG. 14, after depositing of oxide layer 306 over high-stress liner 304, removing of silicon substrate layer 300, and forming of contacts 380 in silicon dioxide layer 302. Deposition of oxide layer 306 may be performed substantially similarly to the similar deposition steps shown and described with reference to FIGS. 2-8. As shown in FIG. 15, high-stress liner 304 helps to induce stress in source/gate regions 370, and thereby improves performance of CMOS device 30. Contacts 380 may provide similar connections to external devices (i.e., circuitry and/or other semiconductor devices) as described with reference to FIG. 7.

The methods and structures as described above are used in the fabrication of semiconductor chips. The resulting semiconductor chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks describing the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a semiconductor device, the method comprising:
   providing a complimentary metal oxide semiconductor (CMOS) device including:
      a silicon substrate layer;
      a silicon dioxide layer thereover; and
      an n-type field effect transistor (NFET) gate having a first recessed source/drain trench and a p-type field effect transistor (PFET) gate having a second recessed source/drain trench, the NFET gate and the PFET gate located over the silicon dioxide layer;
   depositing a nitride stress liner in the first recessed source/drain trench and the second recessed source/drain trench;
   depositing an oxide layer over the nitride stress liner;
   placing the CMOS device on a handling wafer, wherein the oxide layer is closest to the handling wafer;
   removing the silicon substrate layer;
   etching the silicon dioxide layer to form an opening abutting a portion of a source/drain region, the source/drain region abutting one of the first recessed source/drain trench or the second recessed source/drain trench; and
   forming a contact in the opening.

2. The method according to claim 1, wherein the forming of the contact includes depositing a silicide in the opening.

3. The method of claim 2, wherein the forming of the contact further includes depositing a contact metal over the silicide.

4. The method according to claim 1, wherein the etching of the silicon dioxide layer is performed by reactive ion etching.

5. The method of claim 1, further comprising planarizing the oxide layer.

6. The method of claim 1, wherein the CMOS device further includes a first spacer abutting the NFET gate and a second spacer abutting the PFET gate, and further comprising:
   removing the first spacer to form the first source/drain trench and removing the second spacer to form the second source/drain trench.

7. The method of claim 1, further comprising: depositing a metal liner over the nitride stress liner before the depositing of the oxide layer.

* * * * *